United States Patent
Lee

(10) Patent No.: US 8,929,837 B2
(45) Date of Patent: Jan. 6, 2015

(54) SIGNAL PROCESSING SYSTEM AND METHOD THEREOF

(71) Applicant: GETAC Technology Corporation, Hsinchu County (TW)

(72) Inventor: Yen-Ching Lee, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 119 days.

(21) Appl. No.: 13/903,902

(22) Filed: May 28, 2013

(65) Prior Publication Data

US 2014/0024319 A1    Jan. 23, 2014

Related U.S. Application Data

(60) Provisional application No. 61/674,775, filed on Jul. 23, 2012.

(51) Int. Cl.
*H04B 1/38* (2006.01)
*H03G 3/20* (2006.01)
*H03G 3/30* (2006.01)

(52) U.S. Cl.
CPC .............. *H03G 3/20* (2013.01); *H03G 3/3078* (2013.01)

USPC ............................................... 455/73; 455/84

(58) Field of Classification Search
USPC ............................ 455/136, 138, 73, 84, 550.1
See application file for complete search history.

(56) References Cited

U.S. PATENT DOCUMENTS

| | | | |
|---|---|---|---|
| 2007/0004358 A1* | 1/2007 | Moorti | 455/226.2 |
| 2009/0227214 A1* | 9/2009 | Georgantas et al. | 455/86 |

* cited by examiner

*Primary Examiner* — Sonny Trinh

(57) ABSTRACT

The signal processing system includes a first signal processing unit, a first route, and a second route. The first signal processing unit receives a first signal and generates a first sub-signal and a second sub-signal. The first route receives the first sub-signal through one end of the first route and outputs the first sub-signal from the other end. The second route receives the first signal transmitted from the antenna through one end of the second route, and outputs the first signal through the other end. The second route includes a second signal processing unit, receives the first signal and generates a third sub-signal and a fourth sub-signal; a gain unit receives the third sub-signal to gain the first signal; and a circuit unit receives the fourth sub-signal, determines whether to enable the gain unit, or to adjust a gain level of the gain unit.

25 Claims, 5 Drawing Sheets

SIGNAL PROCESSING SYSTEM AND METHOD THEREOF

BACKGROUND

1. Field of the Invention

The present invention is directed to a signal processing system and a method thereof.

2. Description of Related Art

Generally, an electronic apparatus utilizes a microcontroller unit (MCU) to control transceiving operations of wireless signals, where the wireless signals are for example, from a wireless local area network (WLAN). However, a too weak wireless signal to be received may probably result in the MCU incapable of normal operation. For example, a received wireless signal can not be correctly read. On the other hand, when the signal to be transmitted by the electronic apparatus lacks sufficient power, the signal may not be transmitted to a predetermined target as expected. Accordingly, how to enhance capability of transceiving the wireless signals while maintaining the original architecture is a major research subject in the field.

SUMMARY

The present invention provides a signal processing system and a method thereof capable of controlling an enablement of a gain unit according to signal strength of a received signal.

The present invention provides a signal processing system configured to transmit signals through an antenna and including a first signal processing unit, a first route and a second route. The first signal processing unit receives a first signal and generates a first sub-signal and a second sub-signal which are processed by the first signal processing unit. The first route receives the first sub-signal through one end thereof and outputs the first sub-signal to the antenna from the other end. The second route receives the first signal transmitted from the antenna through one end of the second route and outputs the first signal transmitted from the antenna through the other end. The second route at least includes a second signal processing unit, a first gain unit and a first circuit unit. The second signal processing unit receives the first signal received by the second route and generates a third sub-signal and a fourth sub-signal which are processed by the second signal processing unit. The first gain unit receives the third sub-signal to gain the first signal. The first circuit unit controls an enablement of the first gain unit after receiving the fourth sub-signal.

The present invention further provides a signal processing method applicable to a signal processing system. First, a first signal is received by a first signal processing unit. A first sub-signal and a second sub-signal are generated according to the first signal by the first signal processing unit. Then, the first sub-signal is transmitted to the first route. When the first signal is received by the second signal processing unit from the second route, a third sub-signal and a fourth sub-signal are generated by the second signal processing unit. Then, the third sub-signal is transmitted to the first gain unit to gain the first signal and the fourth sub-signal is transmitted to the first circuit unit. The enablement of first gain unit is controlled according to the fourth sub-signal by the first circuit unit.

To sum up, the present invention provides a signal processing system and a method thereof capable of self-detecting whether the current signal is a transmitted signal or a received signal, converting the same for transmitting the signal through the first route, receiving the signal through the second route and controlling the enablement of the gain unit according to signal strength of the received signal.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
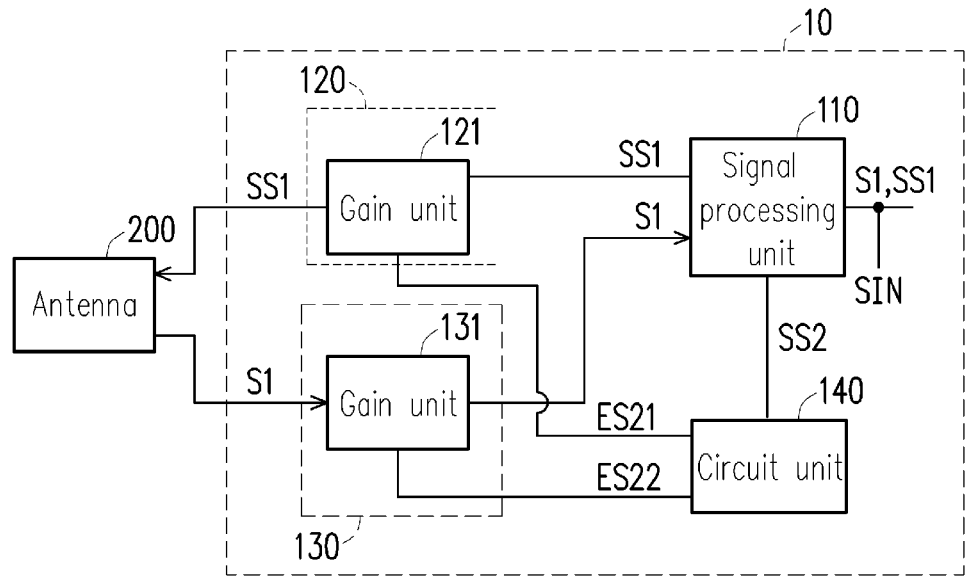
FIG. 1 is a functional block diagram illustrating a signal processing system according to an embodiment of the present invention.

FIG. 1 is a functional block diagram illustrating a signal processing system according to an embodiment of the present invention. With reference to FIG. 1, a signal processing system 10 transmits signals through an antenna 200. The signal processing system 10 includes a signal processing unit 110, a first route 120, a second route 130 and a circuit unit 140. The signal processing unit 110 receives a first signal S1 and generates sub-signals SS1 and SS2 which are processed by the signal processing unit 110.

One end of the first route 120 is coupled to the signal processing unit 110 and receives the sub-signal SS1. The other end of the first route 120 is coupled to the antenna 200 and outputs the sub-signal SS1 to the antenna 200. One end of the second route 130 is coupled to the antenna 200 and receives a first signal S1 transmitted from the antenna 200. The other end of the second route 130 is coupled to signal processing unit 110 outputs the first signal S1 transmitted from the antenna 200 to the signal processing unit 110.

In the present embodiment, the second route 130 further includes a gain unit 131 configured to gain the first signal S1, and the first route 120 also includes a gain unit 121 to gain the sub-signal SS1 transmitted to the antenna 200.

The circuit unit 140 is coupled to the signal processing unit 110 and the gain unit 131, receives the sub-signal SS2 from the signal processing unit 110 and controls an enablement of the gain unit 121 according to the sub-signal SS2.

The enablement controlled according to the sub-signal SS2 includes the following scenarios. First, whether to enable the gain unit 121 or the gain unit 131 is determined according to the sub-signal SS2. Each of the gain unit 121 and the gain unit 131 has a predetermined gain value. After being enabled by the circuit unit 140, the gain unit 121 gain the sub-signal SS1 according to the predetermined gain value and/or the gain unit 131 gain the signal S1 according to the predetermined gain value. Alternatively, the gain unit 121 decides a gain value according to signal strength of the sub-signal SS2 and gains the sub-signal SS1, and/or the gain unit 131 decides the gain value according to signal strength of the sub-signal SS2 and gains the signal S1 according to the gain value.

It should be noticed that the signal processing system 10 includes two operation modes, i.e., a transmitting mode and a receiving mode, and switches between the two modes by the circuit unit 140 selectively enabling the gain unit 121 or the gain unit 131. Before descriptions of the two operation modes, how the signal processing unit 110 is operated is described in advance hereinafter.

The signal processing unit 110 is connected with elements in an electronic apparatus (not shown), such as a wireless communication module or a microcontroller unit (MCU) controlling signal transceiving capability, through the signal point SIN. The signal processing unit 110 may receive the first signal S1 from the signal point SIN, generate the sub-signals SS1 and SS2 after processing the first signal S1 and respectively transmitting the sub-signals SS1 and SS2 to the first route 120 and the circuit unit 140. The signal processing unit 110 may also receive the first signal S1 from the second route 130, generate the sub-signals SS1 and SS2 after processing the first signal S1 and then, respectively transmit the sub-signals SS1 and SS2 to the signal point SIN and the circuit unit 140.

Therein, the sub-signals SS1 and SS2 are generated in a separating manner or a coupling manner by the signal processing unit 110. In the present embodiment, the signal processing unit 110 receives the first signal S1 and generates the sub-signal SS2 by coupling the first signal S1, and the original first signal S1 is converted into the sub-signal SS1. Namely, in the present embodiment, the first signal S1 is identical to the sub-signal SS1, and a proportional relationship of the signal strength exists between the sub-signal SS2 and the first signal S1; but the signal strength of the sub-signal SS2 and the first signal S1 may also be set to be the same. Here, it is sufficient that the signal strength of the sub-signal SS2 is proportional to that of the original first signal S1.

When the signal processing unit 110 adopts the separating manner to generate the sub-signals SS1 and SS2, the signal strength of the sub-signals SS1 and SS2 is substantially proportional to that of the first signal S1. However, since the first signal S1 is substantially identical to the sub-signals SS1 and SS2, in the present invention, the sub-signal SS1 may be still deemed as identical to the first signal S1.

In the present invention, the signal processing unit 110 is incapable of determining whether the first signal S1 flows from the signal point SIN or from the second route 130 and so is incapable of determining whether the current first signal S1 is a transmitted signal or a received signal. Therefore, the circuit unit 140 is further configured in the signal processing system 10 to switch between the transmitting mode and the receiving mode. The circuit unit 140 switches to the transmitting mode or the receiving mode according to the signal strength of the sub-signal SS2 and namely, selects to enable the gain unit 121 or the gain unit 131 according to the signal strength of the sub-signal SS2. How the circuit unit 140 is operated will be described hereinafter.

Figure 2:
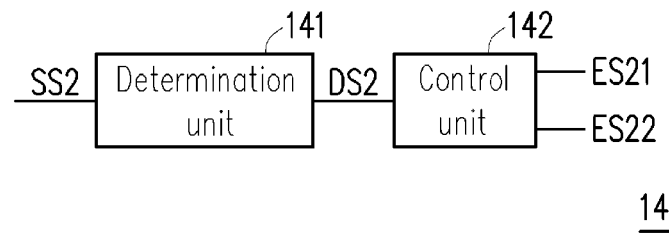
FIG. 2 is a functional block diagram illustrating the circuit unit according to an embodiment of the present invention.

FIG. 2 is a functional block diagram illustrating the circuit unit according to an embodiment of the present invention. With reference to FIG. 2, the circuit unit 140 includes a determination unit 141 and a control unit 142. Following the above description, the determination unit 141 receives the sub-signal SS2 from the signal processing unit 110 and converts the sub-signal SS2 into a determination signal DS2. In the present embodiment, the determination unit 141 converts the sub-signal SS2 into the determination signal DS2 corresponding to the signal strength level of the sub-signal SS2, where the determination signal DS2 is a digital signal having a value corresponding to the signal strength level of the sub-signal SS2.

The control unit 142 is coupled to the determination unit 141, receives the determination signal DS2 from the determination unit 141 and determines whether to enable the gain units 121 and 131 according to the determination signal DS2. In the present embodiment, the control unit 142 compares the value of the determination signal DS2 with a predetermined threshold. When the value of the determination signal DS2 is greater than the predetermined threshold, the control unit 142 determines that the current signal processing system 10 is in the transmitting mode, and the first signal S1 flows into the signal processing unit 110 from the signal point SIN. Accordingly, the control unit 142 transmits a control signal ES21 to the gain unit 121 to enable the gain unit 121. When the value of the determination signal DS2 is smaller than the predetermined threshold, the control unit 142 determines that the current signal processing system 10 is in the receiving mode, and the first signal S1 flows into the signal processing unit 110 from the second route 130. Accordingly, the control unit 142 transmits a control signal ES22 to the gain unit 131 to enable the gain unit 131.

In other words, when the value of the determination signal DS2 is greater than the predetermined threshold, the control unit 142 determines that the first signal S1 is a transmitted signal to be transmitted to the antenna 200 through the first route 120. And when the value of the determination signal DS2 is smaller than the predetermined threshold, the control unit 142 determines that the first signal S1 is a received signal received from the antenna 200 through second route 130.

The operation modes switching is determined based on that when the first signal S1 is the transmitted signal, the signal is from the electronic apparatus connected with the signal processing system 10, and when the first signal S1 is the received signal, the signal is from an external signal transmission point of the signal processing system 10. As such, it is found that the signal strength when the first signal S1 is the transmitted signal is certainly different from that when the first signal S1 is the received signal. Namely, the signal strength when the first signal S1 is the transmitted signal is much greater than the signal strength when the first signal S1 is the received signal. Accordingly, the control unit 142 may determine whether the first signal S1 is the received signal or the transmitted signal by comparing the sub-signal SS2 with the predetermined threshold.

It is to be mentioned that the predetermined threshold value is configured depending on factors which include the signal strength difference in proportion between the first signal S1 and the sub-signal SS2 and a quantization level (fine/coarse) for converting the sub-signal SS2 into the determination signal DS2. Besides, power consumption for transmitting each signal (e.g., the first signal S1 and the sub-signals SS1 and SS2) in each route of the system also has to be considered. Accordingly, the predetermined threshold value has to be configured based on the aforementioned factors as well as adjusted with considering actual implementation situations.

The gain units 121 and 131 may be enabled by the control signals ES21 and ES22 according to several configurations, such as controlling the power supply to the gain units 121 and 131 by the control signals ES21 and ES22, or configuring switches on the first route 120 and the second route 130 to turn on the first route 120 or the second route 130 when the control signal ES21 enabling the gain unit 121 or the control signal ES22 enabling the gain unit 131 is received. When the control unit 142 transmits the control signal ES21 to enable the gain unit 121, the control unit 142 may be configured to simultaneously transmit the control signal ES22 to disable the gain unit 131 (for example, by configuring the control signal ES21 and the control signal ES22 to be inverse to each other). The present invention is not intent to limit the configurations.

Referring to FIG. 1 again, with the operation process, the signal processing system 10 may be switched to the operation mode thereof by self-detecting according to the state of the transmitted signal or the received signal. In the present embodiment, the signal processing system 10 is predetermined in the receiving mode, where the first signal S1 is received from the antenna 200, gained by the gain unit 131 in the second route 130 and transmitted by the signal processing unit 110 to the signal point SIN and elements in the electronic apparatus connected with the signal point SIN. Accordingly, in the present embodiment, the gain unit 131 is a low noise amplifier (LNA), which may maintain a low-noise and low-distortion condition while amplifying the first signal S1.

When the first signal S1 flows into the signal processing unit 110 from the signal point SIN, i.e., when the first signal S1 is the transmitted signal, the circuit unit 140 determines that the signal processing system 10 should be switched to the transmitting mode according to the sub-signal SS2 coupled by the signal processing unit 110. The circuit unit 140 enables the gain unit 121 in the first route 120 and disables the gain unit 131 in the second route 131, such that the sub-signal SS1 (which is identical to the first signal S1) may be amplified by the gain unit 121 and transmitted to the antenna 200. In the present embodiment, the gain unit 121 is a power amplifier (PA) configured to enhance the signal strength of the sub-signal SS1 (the first signal S1). The present is not intent to limit the internal circuit structure and configurations in connection with the power amplifier.

By the signal processing system 10 self-detecting whether the current signal (the first signal S1) is the transmitted signal or the received signal to switch to the operation mode thereof, the signal processing system 10 may simultaneously enhance the gain level of the signal in the operation mode (the receiving mode or the transmitting mode).

The gain unit 121 and the gain unit 131 may also be selectively implemented according to different actual situations. For instance, if the signal strength of the first signal S1 itself is sufficient to meet a user's requirement, the gain unit 121 is not necessarily configured in the first route 120. Even when the gain unit 121 is not configured in the first route 120 or the gain unit 131 is not configured in the second route 130, the first route 120 or the second route 130 may include a switch controlled by the control signals ES21 and ES22 to turn on/off the first route 120 or the second route 130. In some actual implementation scenarios, the signal strength of the first signal S1 configured as the received signal is already sufficient for being operated by the external apparatus external elements connected with the signal point SIN), but gained by the gain unit 131 in the second route 130 to be approximate to the signal strength of the first signal S1 configured as the transmitted signal. If so, the circuit unit 140 may not be normally switched to the two modes of the signal processing system 10 (due to, for example, insufficiently fine quantization level for converting into the determination signal DS2). Accordingly, the present invention further provides the following configurations to avoid the aforementioned issue.

Figure 3:
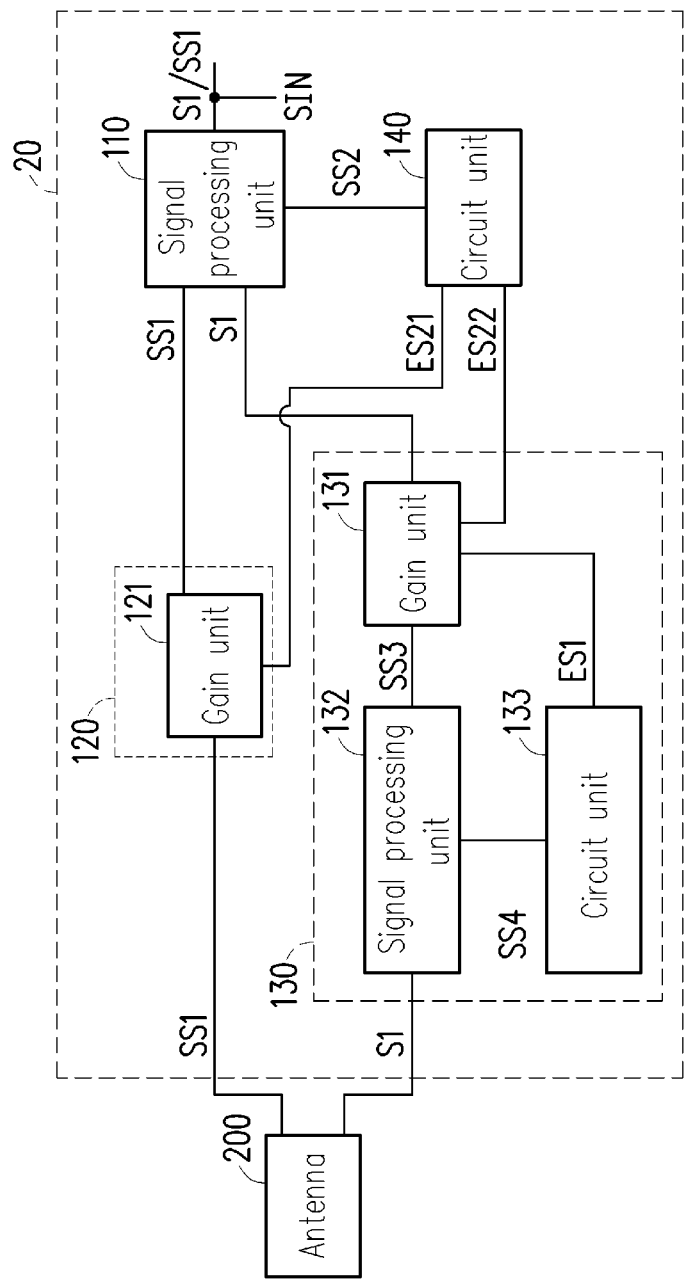
FIG. 3 is a functional block diagram illustrating the signal processing system according to another embodiment of the present invention.

FIG. 3 is a functional block diagram illustrating a signal processing system according to another embodiment of the present invention. The coupling relationship between each element in the embodiment illustrated in FIG. 3 is identical to the embodiment illustrated in FIG. 1 and will not repeatedly described. The embodiment illustrated in FIG. 3 is different from the embodiment illustrated in FIG. 1 in that the second route 130 further includes a signal processing unit 132 and a circuit unit 133 in the embodiment illustrated in FIG. 3.

With reference to FIG. 3, the signal processing unit 132 is coupled between the antenna 200 and the gain unit 131, receives the first signal S1 from the antenna 200, processes the first signal S1 to generate sub-signals SS3 and SS4 and transmits the sub-signal SS3 to the gain unit 131 to gain the first signal S1. In the present embodiment, the signal processing unit 132 couples the first signal S1 to generate the sub-signal SS4 and converts the first signal S1 into the sub-signal SS3. Namely, the sub-signal SS3 is identical to the original first signal S1, and signal strength of the sub-signal SS4 is proportional to that of the first signal S1.

The circuit unit 133 is coupled to the signal processing unit 132 and the gain unit 131, receives the sub-signal SS4 from the signal processing unit 132 and controls the enablement of the gain unit 131 according to the sub-signal SS4, for example, determines whether to enable the gain unit 131 according to the sub-signal SS4.

When the circuit unit 133 enables the gain unit 131, the gain unit 131 gains the sub-signal SS3 according to a predetermined gain value, or alternatively, the gain unit 131 decides a gain value according to the signal strength of the sub-signal SS4 and gains the sub-signal SS3 according to the decided gain value.

Figure 4:
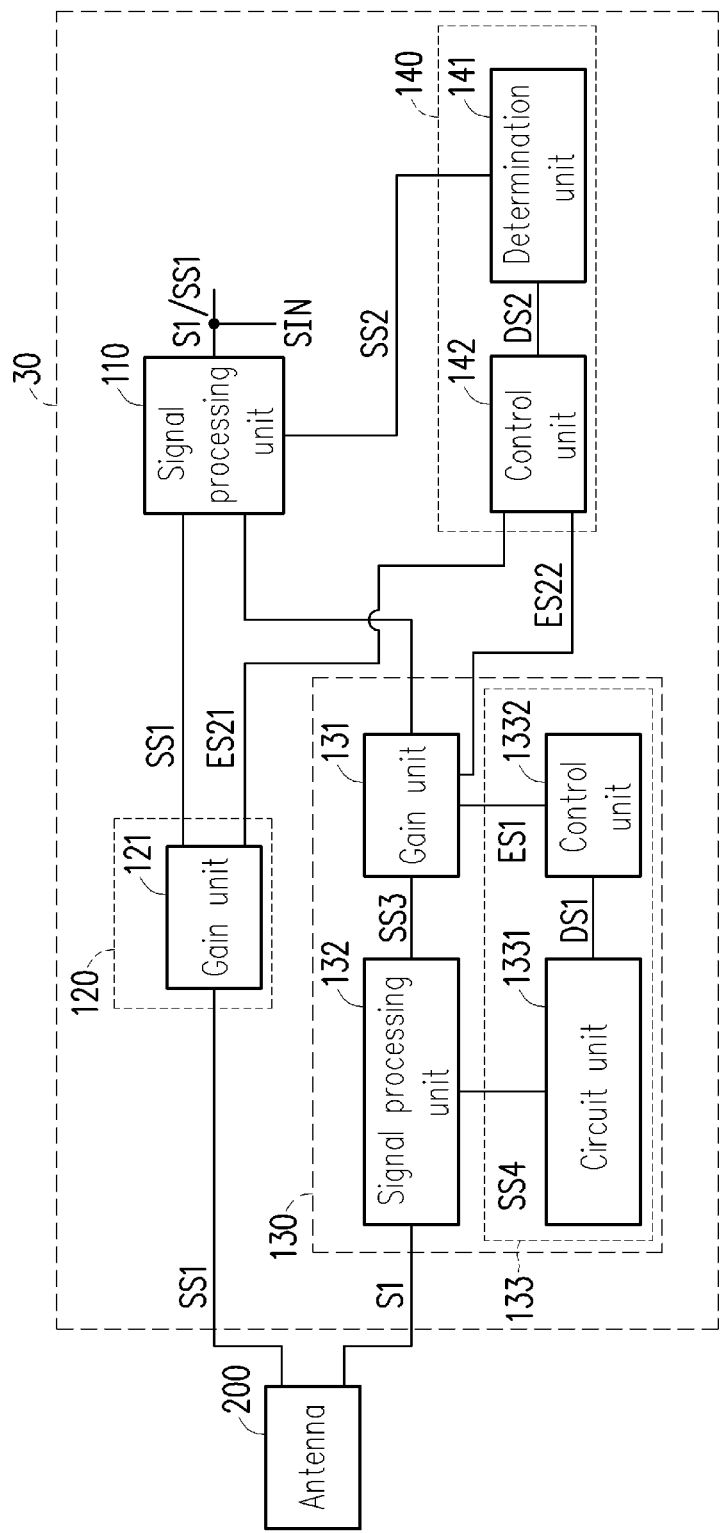
FIG. 4 is a functional block diagram illustrating a signal processing system according to still another embodiment of the present invention.

FIG. 4 is a functional block diagram illustrating a signal processing system according to another embodiment of the present invention. Differing from the embodiment illustrated in FIG. 3, the embodiment illustrated in FIG. 4 provides a more detailed manner for implementing the circuit units 133 and 140. With reference to FIG. 4, the circuit unit 133 further includes a determination unit 1331 and a control unit 1332. The determination unit 1331 receives the sub-signal SS4 from the signal processing unit 132 and converts the received sub-signal SS4 into a determination signal DS1. In the present embodiment, the determination unit 1331 converts the sub-signal SS4 into the determination signal DS1 corresponding to signal strength of the sub-signal SS4, and the determination signal DS1 is a digital signal having a value corresponding to the signal strength of the sub-signal SS4.

The control unit 1332 is coupled to the determination unit 1331, receives the determination signal DS1 from the determination unit 1331, and controls the enablement of the gain unit 131 according to the determination signal DS1. In the present embodiment, the control unit 1332 compares a value of the determination signal DS1 with a predetermined threshold. When the value of the determination signal DS1 is greater than the predetermined threshold, the control unit 1332 determines that the signal strength of the current first signal S1 (or the sub-signal SS3 identical to the first signal S1) is strong enough and does not need to be gained by the gain unit 131. Thus, the control unit 1332 transmits the control signal ES1 to the gain unit 131 to disable the gain unit 131.

On the other hand, when the value of the determination signal DS1 is smaller than the predetermined threshold, the control unit 1332 determines that the signal strength of the current first signal S1 (or the sub-signal SS3 identical to the first signal S1) is weak, and accordingly, the control unit 1332 transmits the control signal ES1 to the gain unit 131 to enable the gain unit 131. The coupling relationship between each element in the circuit unit 133 and operation principle thereto is the same as the embodiment illustrated in FIG. 2 and will be repeatedly described hereinafter.

In fact, in the present embodiment, the signal processing unit 110 and the signal processing unit 132 are operated likewise, the circuit unit 140 and the circuit unit 133 are operated likewise, but only the signal processing unit 110 and the circuit unit 140 are operated differently from the circuit unit 132 and the circuit unit 133 in a signal processing system 30. The circuit unit 140 controls the operation mode (the transmitting mode and the receiving mode) of the signal processing system 30, while the circuit unit 133 controls the enablement of the gain unit 131 and controls the gain value according to which the gain unit 131 gains the signal.

It should be noticed that even when the circuit unit 133 transmits the control signal ES1 to the gain unit 131 to disable gain unit 131, the second route 130 is not cut off. However, in the aforementioned implementation manners, the first route 120 or the second route 130 may sometimes be temporarily disconnected when the circuit unit 140 switches operation modes.

In the embodiments illustrated in FIG. 3 and FIG. 4, the signal processing unit 132 and the circuit unit 133 are additionally configured in the second route 130 to disable the gain unit 131 when the first signal S1 configured as the received signal is too strong. As such, the signal processing systems 20 and 30 may avoid the circuit unit 140 being incapable of correctly switching the two operation modes of the signal processing systems 20 and 30 due to the signal strength of the first signal S1 configured as the received signal being approximate to the first signal S1 (or the first sub-signal SS1) configured as the transmitted signal.

Figure 5:
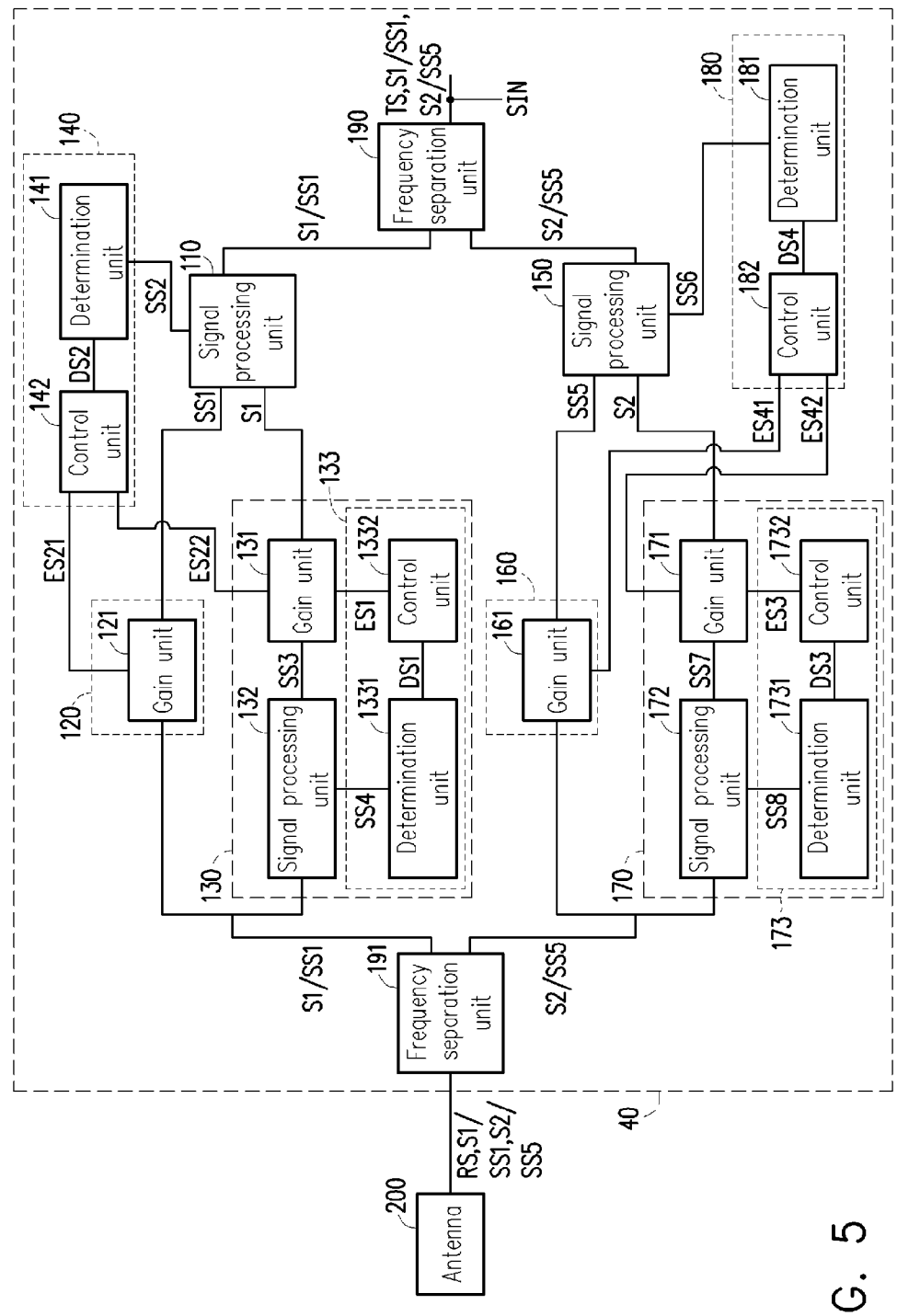
FIG. 5 is a functional block diagram illustrating a signal processing system according to yet another embodiment of the present invention.

On the other hand, the present invention also provides a signal processing system capable of enhancing transmitted and received signals of two types of frequency. FIG. 5 is a functional block diagram illustrating a signal processing system according to yet another embodiment of the present invention. With reference to FIG. 5, the coupling between each unit configured to transceiver the first signal SS1 (or the sub-signal SS1), including the signal processing unit 110, the first route 120, the second route 130 and the circuit unit 140, and the operation thereof may refer to the embodiments illustrated in FIG. 1 through FIG. 3 and will not repeatedly described hereinafter. Each unit configured to transceiver the second signal S2 (or the sub-signal SS5), including the signal processing unit 150, the third route 160, the fourth route 170 and the circuit unit 180 may also refer to the embodiments illustrated in FIG. 1 through FIG. 3 and will not repeatedly described hereinafter.

What is different lies in that the first signal S1 and the second signal S2 has different frequencies. For example, the first signal S1 and the second signal S2 may be wireless signals conforming to the Wireless Fidelity (WiFi) standard with frequencies of 2.4 GHz and 5 GHz, respectively, and the present invention is not limited thereto.

In FIG. 5, a signal processing system 40 further includes frequency separation units 190 and 191. The frequency separation unit 190 is coupled between the signal processing units 110 and 150 and the signal point SIN. When the frequency separation unit 190 receives a transmitted signal TS from the signal point SIN (e.g., transmits a transmitted signal from a wireless network module to the signal point SIN), the frequency separation unit 190 determines whether the transmitted signal TS is the first signal S1 or the second signal S2 by using the frequency (the center frequency) of the transmitted signal TS. When determining that the transmitted signal TS is the first signal S1, the frequency separation unit 190 transmits the first signal S1 to the signal processing unit 110.

When determining that the transmitted signal TS is the second signal S2, the frequency separation unit 190 transmits the second signal S2 to the signal processing unit 150. On the other hand, when receiving the first signal S1 (the sub-signal SS1) from the signal processing unit 110, the frequency separation unit 190 transmits the first signal S1 to the signal point SIN and an external apparatus connected with the signal point SIN. When receiving the second signal S2 (the sub-signal SS5) from the signal processing unit 150, the frequency separation unit 190 also transmits the second signal S2 to the signal point SIN.

The frequency separation unit 191 is coupled between the first route 120, the second route 130, the third route 160, the fourth route 170 and the antenna 200. When receiving a received signal RS from the antenna, the frequency separation unit 191 determines whether the received signal RS is the first signal S1 or the second signal S2 by using the frequency (the center frequency) of the received signal RS. When determining that the received signal RS is the first signal S1, the frequency separation unit 191 transmits the first signal S1 to the second route 130. When determining that the received signal RS is the second signal S2, the frequency separation unit 191 transmits the second signal S2 to the fourth route 170.

In fact, when determining that the received signal RS if the first signal S1, the frequency separation unit 191 transmits the first signal S1 to the first route 120 and the second route 130 simultaneously. However, since the first route 120 is disconnected when the signal processing system 40 is in the receiving mode, the first signal S1 merely passes through the second route 140. Likewise, when determining that the received signal RS is the second signal S2, the frequency separation unit 191 transmits the second signal S2 to the third route 150 and the fourth route 170 simultaneously. However, since the third route 150 is disconnected when the signal processing system 40 is in the receiving mode, the second signal S2 merely passes through the fourth route 170.

On the other hand, when receiving the first signal S1 (the sub-signal SS1) from the first route 120, the frequency separation unit 191 transmits the first signal S1 to the antenna 200. When receiving the second signal S2 (the sub-signal SS5) from the third route 150, the frequency separation unit 191 also transmits the second signal S2 to the antenna 200.

Accordingly, by separating the transmitted/received of two different frequencies using the frequency separation units 190 and 191, the signal processing system 40 may self-detect and gain signal strength for the signals having different center frequencies.

If the frequency separation units 190 and 191 may separate out wireless signals of more frequencies, the signal processing system 40 may connect a signal processing unit, routes and circuit units, which have the same coupling relationship as that among the current signal processing unit, current routes and circuit units, in parallel between the frequency separation units 190 and 191. As such, the signal processing system 40 may be configured to process wireless signals of more frequencies, but the present invention is not limited thereto.

Furthermore, the signal processing system 40 illustrated in FIG. 5 merely has simplex capability. Namely, when the signal processing system 40 is operated, only one of the first route 120, the second route 130, the third route 160 and the fourth route 170 is available for the signal to pass through in one time, and the circuit unit 140 and 180 are used to switch and turn on the route. However, with wire redesign of elements coupled between the frequency separation units 190 and 191 and adjustment of the other elements and routes, the signal processing system 40 may also be a multiplex signal processing system, but the present invention is not limited thereto.

Figure 6:
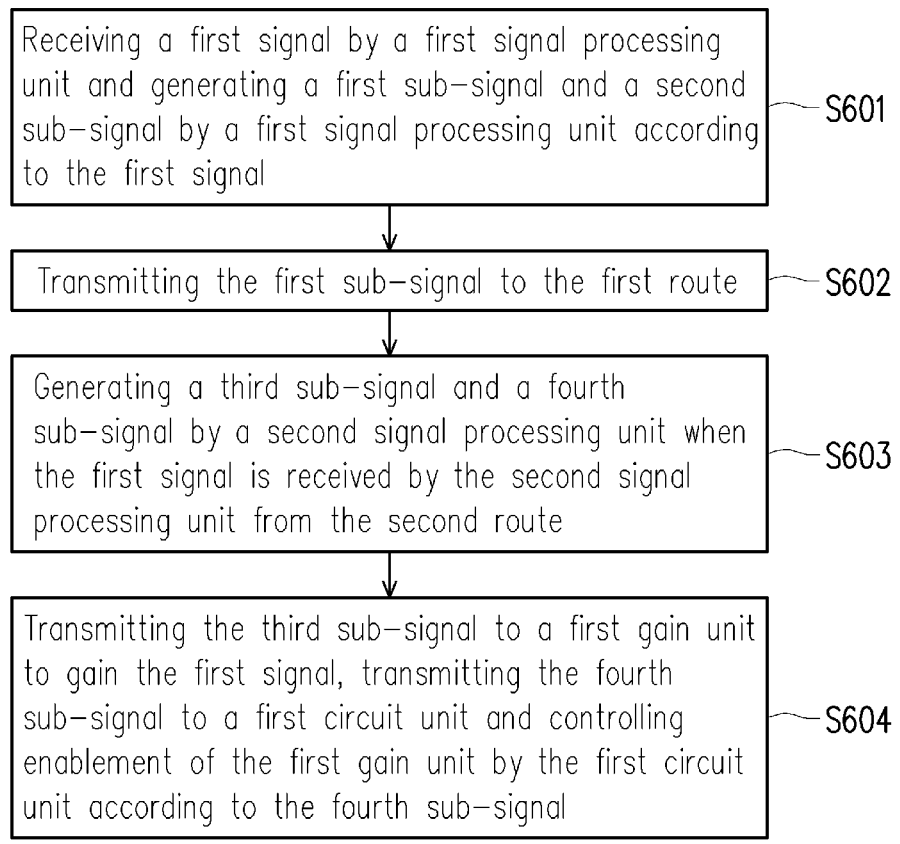
FIG. 6 is a flowchart illustrating a signal processing method according to an embodiment of the present invention.

The present invention provides a signal processing method applicable to a signal processing system. FIG. 6 is a flowchart illustrating a signal processing method according to an embodiment of the present invention. With reference to FIG. 6, first, in step S601, a first signal is received by the first signal processing unit. A first sub-signal and a second sub-signal are generated by the first signal processing unit according to the first signal. Then, in step S602, the first sub-signal is transmitted to the first route. In step S603, i.e. where the first signal is received by a second signal processing unit from a second route, a third sub-signal and a fourth sub-signal are generated by the second signal processing unit. Thereafter, in step S604, the third sub-signal is transmitted to the first gain unit to gain the first signal, and the fourth sub-signal is transmitted to the first circuit unit. The first circuit unit controls enablement of the first gain unit according to the fourth sub-signal. The detail implementation steps may also refer to the descriptions regarding the embodiments illustrated in FIG. 1 through FIG. 5, and will no longer repeatedly described.

It is to be mentioned that the signal processing system of the present invention is not limited to being configured between the antenna and the wireless communication module, but also applicable to other similar conception where the configurations of switching the routes according to of the signal strength.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A signal processing system, configured to transmit signals through an antenna, comprising:
   a first signal processing unit, for receiving a first signal and generating a first sub-signal and a second sub-signal which are processed by the first signal processing unit;
   a first route, for receiving the first sub-signal through one end of the first route and outputting the first sub-signal to the antenna from the other end of the first route; and
   a second route, for receiving the first signal transmitted from the antenna through one end of the second route and outputting the first signal transmitted from the antenna through the other end of the second route;
   wherein the second route at least comprises a second signal processing unit, a first gain unit and a first circuit unit, the second signal processing unit receives the first signal received by the second route and generates a third sub-signal and a fourth sub-signal which are processed by the second signal processing unit, the first gain unit receives the third sub-signal to gain the first signal, and the first circuit unit controls an enablement of the first gain unit after receiving the fourth sub-signal.

2. The system according to claim 1, wherein the second sub-signal is generated by the first signal processing unit separating or coupling the first signal.

3. The system according to claim 1, wherein the fourth sub-signal is generated by the second signal processing unit separating or coupling the first signal.

4. The system according to claim 1, wherein the first circuit unit comprises:
   a first determination unit, coupled to the second signal processing unit, for receiving the fourth sub-signal and converting the fourth sub-signal into a first determination signal; and
   a first control unit, coupled to the first determination unit, for controlling the enablement of the first gain unit according to the first determination signal.

5. The system according to claim 1, wherein
   the first route further comprises a second gain unit; and
   the system further comprises a second circuit unit, coupled to the first signal processing unit, for receiving the second sub-signal and determining whether to enable the first gain unit or the second gain unit according to the second sub-signal.

6. The system according to claim 5, wherein the second circuit unit comprises:
   a second determination unit, coupled to the second signal processing unit, for receiving the second sub-signal and converting the second sub-signal into a second determination signal; and
   a second control unit, coupled to the second determination unit, for determining whether to enable the first gain unit or the second gain unit according to the second determination signal.

7. The system according to claim 5, wherein
   the first gain unit comprises a low noise amplifier; and
   the second gain unit comprises a power amplifier.

8. The system according to claim 1, wherein the system further comprises:
   a third signal processing unit, for receiving a second signal and generating a fifth sub-signal and a sixth sub-signal which are processed by the first signal processing unit;
   a third route, for receiving the fifth sub-signal through one end of the third route and outputting the fifth sub-signal to the antenna from the other end of the fifth sub-signal; and
   a fourth route, for receiving the second signal transmitted from the antenna through one end of the fourth route and outputting the second signal transmitted from the antenna through the other end of the fourth route;
   wherein the fourth route at least comprises a fourth signal processing unit, a third gain unit and a third circuit unit, the fourth signal processing unit receives the second signal received by the fourth route and generates a seventh sub-signal and an eighth sub-signal which are processed by the fourth signal processing unit, the third gain unit receives the seventh sub-signal to gain the second signal, and the second circuit unit controls an enablement of the third gain unit after receiving the eighth sub-signal.

9. The system according to claim 8, wherein the system further comprises:
   a first frequency separation unit, coupled to the first signal processing unit and the third signal processing unit, for receiving a transmitted signal from the external of the system, determining whether the transmitted signal is the first signal or the second signal according to a frequency of the transmitted signal, transmitting the first signal to the first signal processing unit when the transmitted signal is the first signal and transmitting the second signal to the third signal processing unit when the transmitted signal is the second signal.

10. The system according to claim 9, wherein the system further comprises:
    a second frequency separation unit, coupled to the first route, the second route, the third route and the fourth route,
    wherein when receiving a received signal from the antenna, the second frequency separation unit determines whether the received signal is the first signal or the second signal according to a frequency of the received signal, transmits the first signal to the second route when the received signal is the first signal and transmits the second signal to the fourth route when the received signal is the second signal, and
wherein when the second frequency separation unit receives the first sub-signal or the fifth sub-signal from the first route or the third route, the second frequency separation unit transmits the first sub-signal or the fifth sub-signal to the antenna.

11. The system according to claim 8, wherein
the sixth sub-signal is generated by the third signal processing unit separating or coupling the second signal.

12. The system according to claim 8, wherein
the eighth sub-signal is generated by the fourth signal processing unit separating or coupling the second signal.

13. The system according to claim 8, wherein the third circuit unit comprises:
a third determination unit, coupled to the fourth signal processing unit, for receiving an eighth sub-signal and converting the eighth sub-signal into a third determination signal; and
a third control unit, coupled to the third determination unit, for determining whether to enable the third gain unit according to the third determination signal.

14. The system according to claim 8, wherein
the third route further comprises a fourth gain unit; and
the system further comprises a fourth circuit unit, coupled to the third signal processing unit, for receiving the sixth sub-signal and determining whether to enable the third gain unit or the fourth gain unit according to the sixth sub-signal.

15. The system according to claim 14, wherein the fourth circuit unit comprises:
a fourth determination unit, coupled to the third signal processing unit, for receiving the sixth sub-signal and converting the sixth sub-signal into a fourth determination signal; and
a fourth control unit, coupled to the fourth determination unit, for determining whether to enable the fourth gain unit according to the fourth determination signal.

16. The system according to claim 14, wherein
the third gain unit comprises a low noise amplifier; and
the fourth gain unit comprises a power amplifier.

17. A signal processing method, applicable to a signal processing system, wherein the signal processing system comprises a first signal processing unit transmitting signals to an antenna through a first route, and receiving signals from the antenna through a second route, and the second route comprises a first gain unit and a first circuit unit, the method comprising:
the first signal processing unit receiving a first signal and generating a first sub-signal and a second sub-signal according to the first signal;
transmitting the first sub-signal to the first route;
generating a third sub-signal and a fourth sub-signal by a second signal processing unit when the first signal is received by the second signal processing unit from the second route; and
transmitting the third sub-signal to the first gain unit to gain the first signal, transmitting the fourth sub-signal to the first circuit unit and controlling an (enablement of the first gain unit according to the fourth sub-signal by the first circuit unit.

18. The method according to claim 17, wherein the first gain unit has a predetermined gain value, and after the step of controlling the enablement of the gain unit according to the fourth sub-signal, the method comprises:
gaining the first signal according to the predetermined gain value by the gain unit when the first gain unit is enabled.

19. The method according to claim 17, wherein after the step of controlling the enablement of the gain unit according to the fourth sub-signal, the method comprises:
deciding a gain value according to signal strength of the first signal and the third sub-signal by the first gain unit; and
gaining the first signal by the first gain unit according to the gain value.

20. The method according to claim 17, wherein the first circuit unit comprises a first determination unit and a first control unit, and the step of controlling the enablement of the first gain unit according to the fourth sub-signal by the first circuit unit comprises:
transmitting the fourth sub-signal to the first determination unit to convert the fourth sub-signal into a first determination signal; and
transmitting the first determination signal to the first control unit to control the enablement of the first gain unit according to the first determination signal.

21. The method according to claim 17, wherein the signal processing system further comprises a second circuit unit, the first route further comprises a second gain unit, and after the step of generating the first sub-signal and the second sub-signal according to the first signal by the first signal processing unit, the method further comprises:
transmitting the second sub-signal to the second circuit unit; and
determining by the second circuit unit whether to enable the first gain unit or the second gain unit according to the second sub-signal.

22. The method according to claim 17, wherein the signal processing system further comprises a third signal processing unit, a third route and a fourth route, the fourth route at least comprises a fourth signal processing unit, a third gain unit and a third circuit unit, and the method comprises:
receiving the second signal by the third signal processing unit, and generating a fifth sub-signal and a sixth sub-signal according to the second signal by the third signal processing unit;
transmitting the fifth sub-signal to the third route;
generating a seventh sub-signal and an eighth sub-signal by the fourth signal processing unit when the second signal is received by the fourth signal processing unit from the fourth route; and
transmitting the seventh sub-signal to the third gain unit to gain the second signal, transmitting the eighth sub-signal to the third circuit unit, and controlling an enablement of the third gain unit according to the eighth sub-signal by the third circuit unit.

23. The method according to claim 22, wherein the third gain unit has a predetermined gain value and after the step of controlling the enablement of the third gain unit by the third circuit unit according to the eighth sub-signal, the method comprises:
gaining the second signal by the third gain unit according to the predetermined gain value when the third gain unit is enabled.

24. The method according to claim 22, wherein after the step of controlling the enablement of the third gain unit according to the eighth sub-signal, the method comprises:
deciding a gain value by the third gain unit according to a signal strength of the second signal and the seventh sub-signal; and
gaining the second signal by the third gain unit according to the gain value.

25. The method according to claim 22, wherein the signal processing system further comprises a fourth circuit unit, the third route further comprises a fourth gain unit, and after the step of generating the fifth sub-signal and the sixth sub-signal according to the second signal by the third signal processing unit, the method further comprises:

transmitting the sixth sub-signal to the fourth circuit unit; and determining by the fourth circuit unit whether to enable the third gain unit or the fourth gain unit according to the sixth sub-signal.

* * * * *